(12) United States Patent
Ichinose et al.

(10) Patent No.: US 9,974,212 B2
(45) Date of Patent: May 15, 2018

(54) ELECTRONIC EQUIPMENT

(71) Applicant: FUJITSU LIMITED, Kawasaki-shi, Kanagawa (JP)

(72) Inventors: Takashi Ichinose, Wako (JP); Takashi Yamamoto, Nerima (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/440,436

(22) Filed: Feb. 23, 2017

(65) Prior Publication Data

US 2017/0265336 A1    Sep. 14, 2017

(30) Foreign Application Priority Data

Mar. 10, 2016    (JP) .................................. 2016-046644

(51) Int. Cl.
| | |
|---|---|
| *H05K 7/20* | (2006.01) |
| *F28F 23/00* | (2006.01) |
| *G06F 1/20* | (2006.01) |
| *H01L 23/473* | (2006.01) |
| *H01L 23/427* | (2006.01) |
| *F28D 15/02* | (2006.01) |

(52) U.S. Cl.
CPC ......... *H05K 7/20772* (2013.01); *F28F 23/00* (2013.01); *G06F 1/20* (2013.01); *G06F 1/203* (2013.01); *H05K 7/203* (2013.01); *H05K 7/2029* (2013.01); *H05K 7/20236* (2013.01); *H05K 7/20272* (2013.01); *H05K 7/20336* (2013.01); *H05K 7/20781* (2013.01); *H05K 7/20809* (2013.01); *F28D 15/0266* (2013.01); *H01L 23/427* (2013.01); *H01L 23/473* (2013.01)

(58) Field of Classification Search
None
See application file for complete search history.

(56) References Cited

U.S. PATENT DOCUMENTS 5,305,184 A * 4/1994 Andresen ................ H01L 23/44
165/104.33

FOREIGN PATENT DOCUMENTS

| JP | 04-372159 A |   | 12/1992 |
|---|---|---|---|
| JP | 04372159 A | * | 12/1992 |

* cited by examiner

*Primary Examiner* — Dimary Lopez Cruz
*Assistant Examiner* — Zhengfu Feng
(74) *Attorney, Agent, or Firm* — Squire Patton Boggs (US) LLP

(57) ABSTRACT

An electronic equipment includes a refrigerant tank that contains a refrigerant, an electronic component, a through card electrically coupled to the electronic component, and a pouch of which one end side is in a close contact with the through card so as to seal the electronic component, wherein the electronic component is immersed in the refrigerant of the refrigerant tank in a state of being sealed in the pouch.

5 Claims, 10 Drawing Sheets

ELECTRONIC EQUIPMENT

CROSS-REFERENCE TO RELATED APPLICATION

This application is based upon and claims the benefit of priority of the prior Japanese Patent Application No. 2016-046644, filed on Mar. 10, 2016, the entire contents of which are incorporated herein by reference.

FIELD

The embodiments discussed herein are related to a liquid immersion cooling type electronic equipment.

BACKGROUND

There has been a growing demand for mounting electronic components such as, for example, storages with a high density, in a data center. In the meantime, a heating value of electronic components used in an electronic equipment is increasing with the implementation of the electronic equipment with high performance.

When the electronic components having a large heating value are mounted with high density, the temperature of the electronic components may exceed an allowable upper limit temperature thereby causing a malfunction or a failure. Thus, there has been a demand for a cooling method that is capable of sufficiently cooling the electronic components having a large heating value even when the electronic components are mounted with high density.

As one of the cooling methods, it has been suggested to immerse the electronic components in a refrigerant so as to cool the electronic components.

For example, a liquid immersion cooling type electronic equipment has been suggested in which a fluorine-based inert liquid is used as a refrigerant, and electronic components are directly immersed in the inert liquid. However, the direct contact of generally distributed electronic components such as, for example, hard disks with an inert liquid has not been considered. Thus, when these electronic components are directly immersed in the inert liquid and used for an extended period of time, the reliability thereof may not be satisfied.

Thus, a cooling method has been suggested in which each electronic component is put into a liquid resistant pouch and immersed in a refrigerant.

In the data center, a redundancy is provided not to hinder the system even when a portion of electronic components is failed. In addition, the electronic components have a structure in which the electronic components may be replaced with new electronic components in a state where the system is being operated (so-called a hot swap).

However, in the above-described method in which each electronic component is put into a pouch and immersed in a refrigerant, the top side of the pouch is opened such that the electronic components are connected to a circuit board disposed at an upper portion of a refrigerant tank through a connector. Thus, in order to replace the electronic components, the system is required to be stopped and the board is required to be lifted up.

The following is a reference document.
[Document 1] Japanese Laid-Open Patent Publication No. 4-372159.

SUMMARY

According to an aspect of the embodiments, an electronic equipment includes: a refrigerant tank that contains a refrigerant; an electronic component; a through card electrically coupled to the electronic component; and a pouch of which one end side is in a close contact with the through card so as to seal the electronic component, wherein the electronic component is immersed in the refrigerant of the refrigerant tank in a state of being sealed in the pouch.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments will be described with reference to the accompanying drawings.

Figure 1:
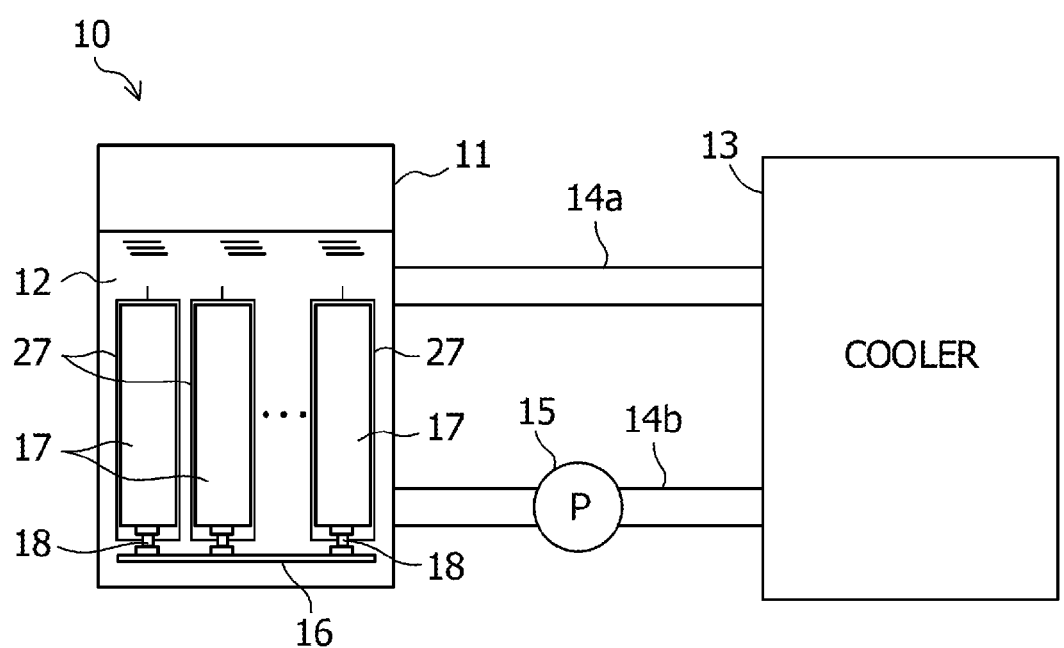
FIG. 1 is a schematic view of an electronic equipment according to an embodiment.

FIG. 1 is a schematic view of an electronic equipment according to an embodiment.

As illustrated in FIG. 1, an electronic equipment 10 according to the present embodiment includes a refrigerant tank 11 containing a refrigerant 12. The refrigerant tank 11 is connected to a cooler 13 for cooling the refrigerant 12 through pipes 14a and 14b. For example, an air or water cooling type chiller may be used as the cooler 13.

A pump 15 is disposed in the middle of the pipe 14b, and the refrigerant 12 is circulated between the refrigerant tank 11 and the cooler 13 by the pump 15. For example, an inert liquid (an electrically inert liquid) such as, for example, hydrofluoroether may be used as the refrigerant 12. In addition, the inert liquid that may be used as the refrigerant 12 is not limited to the fluorine-based liquid.

A circuit board (a backplane or a midplane) 16 is disposed on the bottom portion of the refrigerant tank 11. In the refrigerant 12, each of a plurality of electronic components is immersed in a state of being sealed in a pouch 27. The electronic component 17 is electrically connected to the circuit board 16 through a through card 18.

Since the inert liquid used as the refrigerant 12 has a high insulating property, problems such as, for example, a short circuit, do not occur even when, for example, wires of the circuit board 16 and the through card 18 are in contact with the refrigerant 12. In addition, in the present embodiment, descriptions are made on a case where the electronic component 17 is a hard disk.

Figure 2:
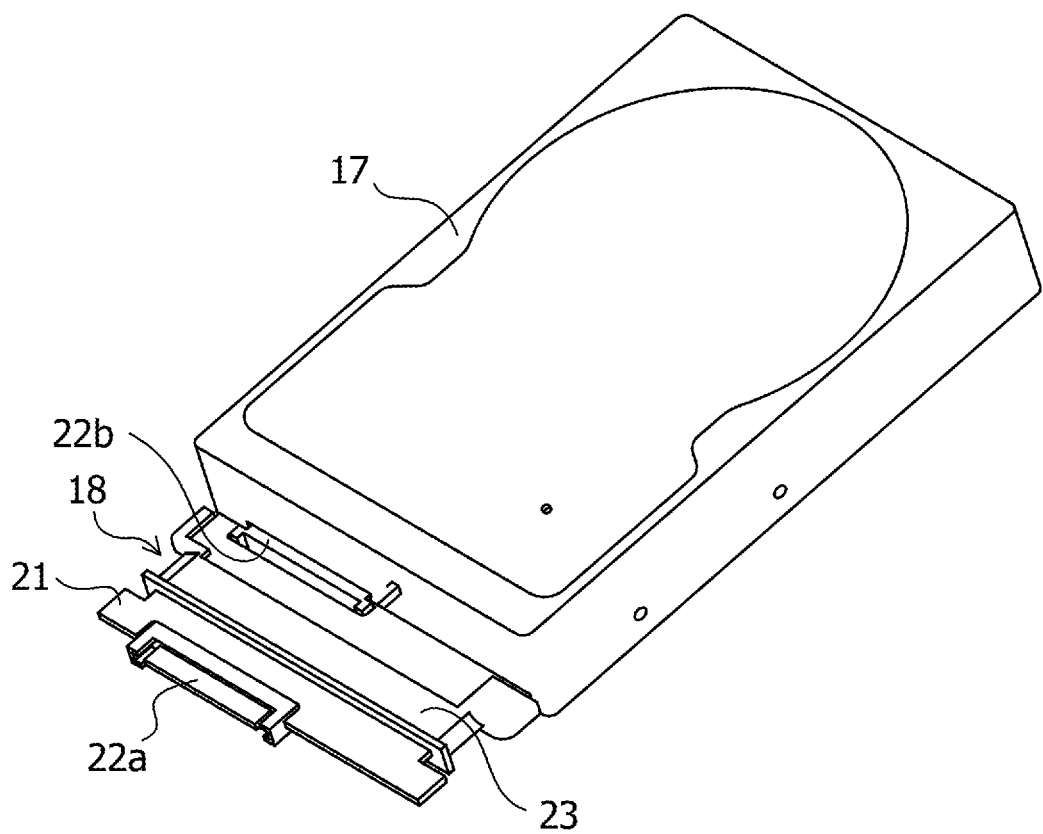
FIG. 2 is a perspective view illustrating a connection state between an electronic component and a through card.
Figure 3:
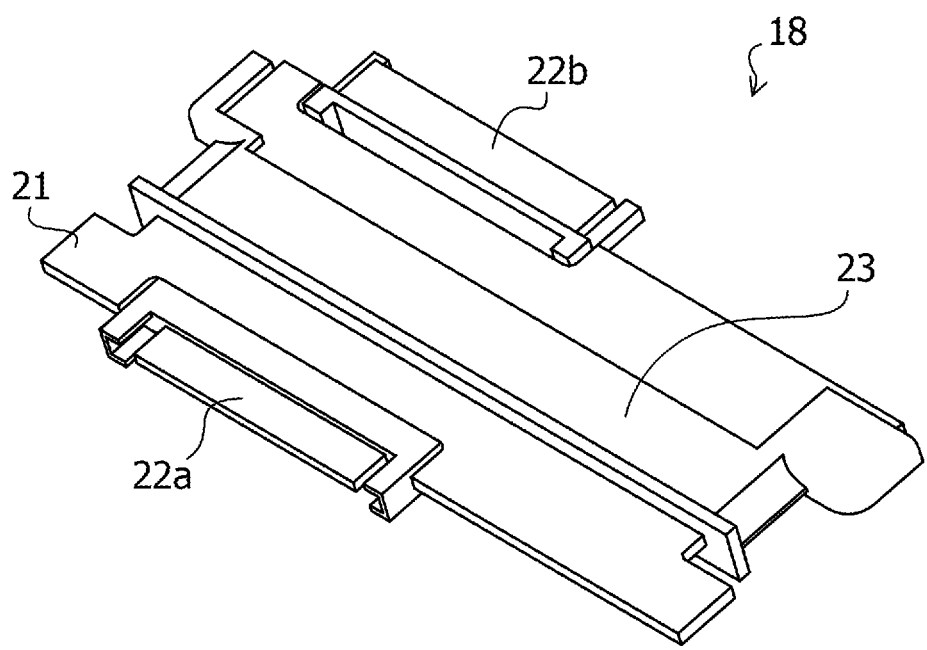
FIG. 3 is an enlarged perspective view of the through card.

FIG. 2 is a perspective view illustrating a connection state between the electronic component 17 and the through card 18, and FIG. 3 is an enlarged perspective view illustrating the through card 18. However, FIG. 2 omits illustration of the pouch 27.

The through card 18 includes a substrate 21, a connector 22a provided on one side of the substrate 21 to be connected to the circuit board 16, and a connector 22b provided on the other side of the substrate 21 to be connected to the electronic component 17.

A wire (not illustrated) is provided in the substrate 21 to electrically interconnect the connectors 22a and 22b. The portion of the substrate 21 between the connectors 22a and 22b is covered with a molded resin. Hereinafter, the portion of the molded resin will be referred to as a "resin portion 23."

Figure 4:
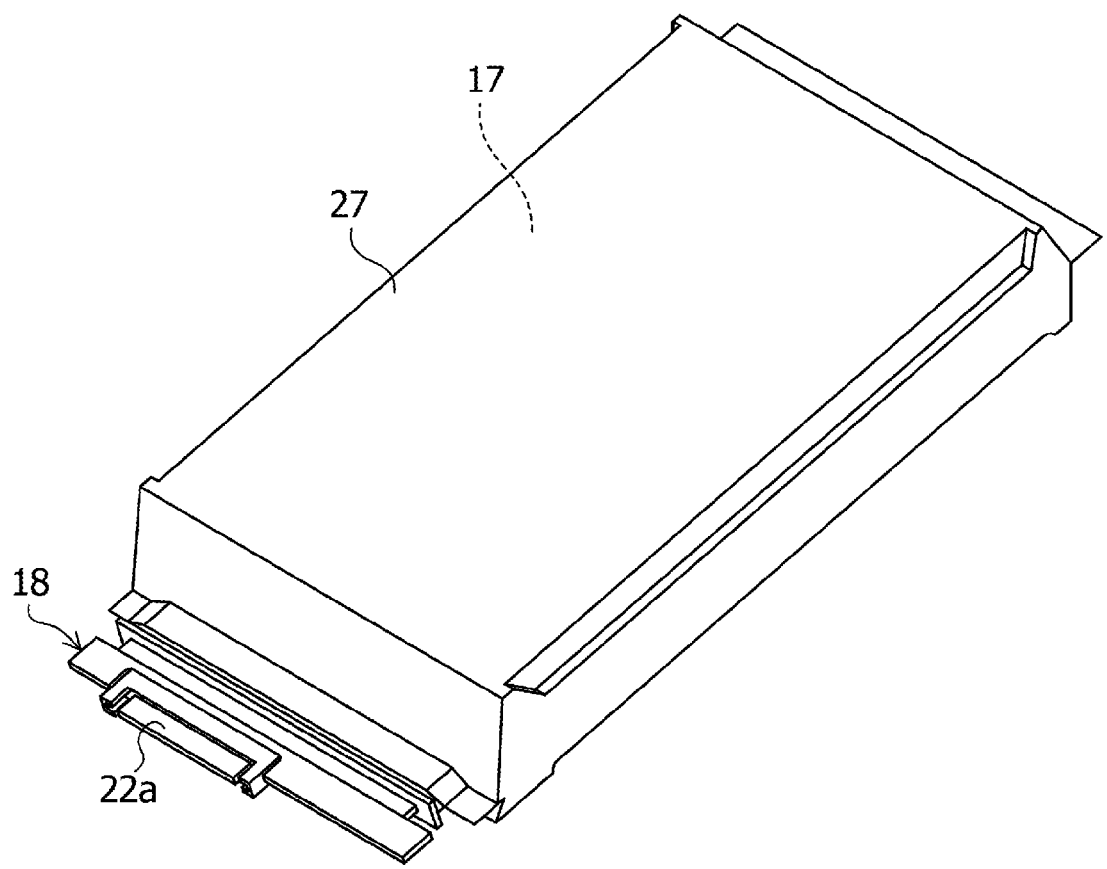
FIG. 4 is a perspective view illustrating the electronic component in a state of being sealed in a pouch.
Figure 5:
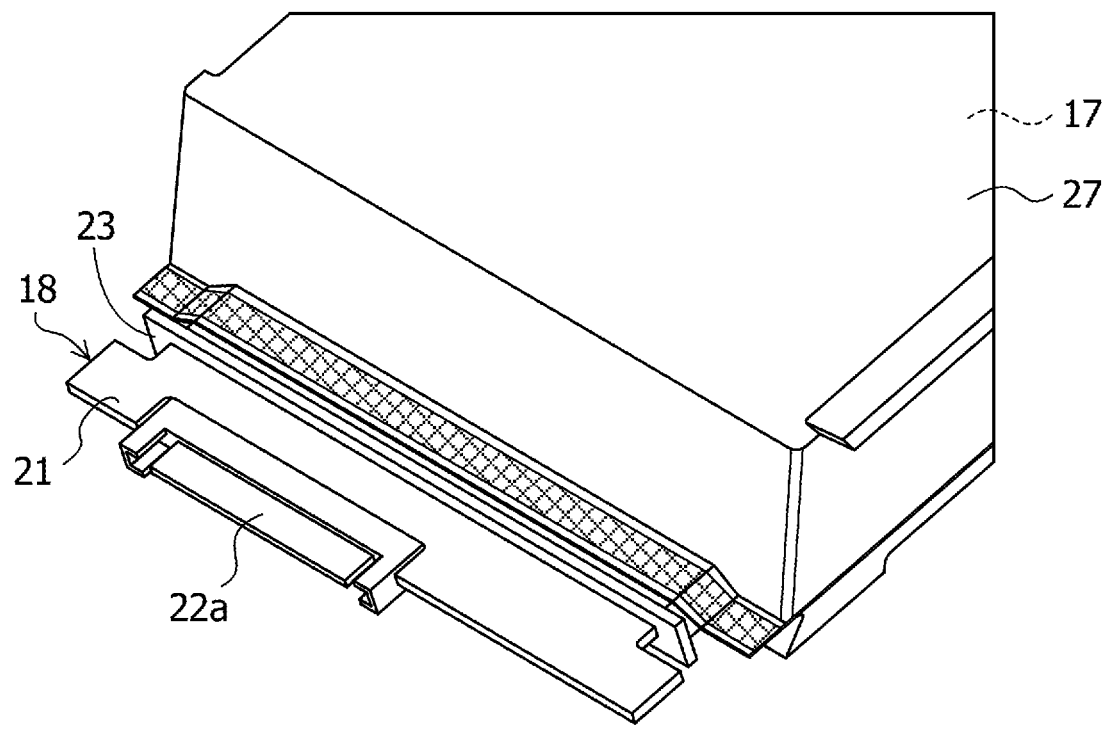
FIG. 5 is an enlarged perspective view of an adhesion portion between a resin portion of the through card and the pouch.

FIG. 4 is a perspective view illustrating the electronic component 17 in the state of being sealed in the pouch 27. FIG. 5 is an enlarged perspective view of an adhesion portion between the resin portion 23 of the through card 18 and the pouch 27.

The pouch 27 is formed in a tubular shape, and one end side thereof is heat-welded (heat-sealed) to the circumference of the resin portion 23 of the through card 18. The mesh-shaped hatched portion in FIG. 5 indicates the portion of the pouch 27 heat-welded to the resin portion 23.

The other end side of the pouch 27 is sealed by, for example, a heat welding after the electronic component 17 is connected to the through card 18, and the inside of the pouch 27 is decompressed. As described above, in the present embodiment, the electronic component 17 is sealed in the liquid resistant pouch 27 thereby avoiding that the electronic component 17 is in direct contact with the refrigerant 12.

The pouch 27 may be any pouch that has a resistance against the refrigerant 12 and may be adhered to the resin portion 23 with a sufficient strength, and is formed of, for example, a resin such as, for example, polyethylene, polypropylene, or polyethylene terephthalate (PET).

Figure 6A:
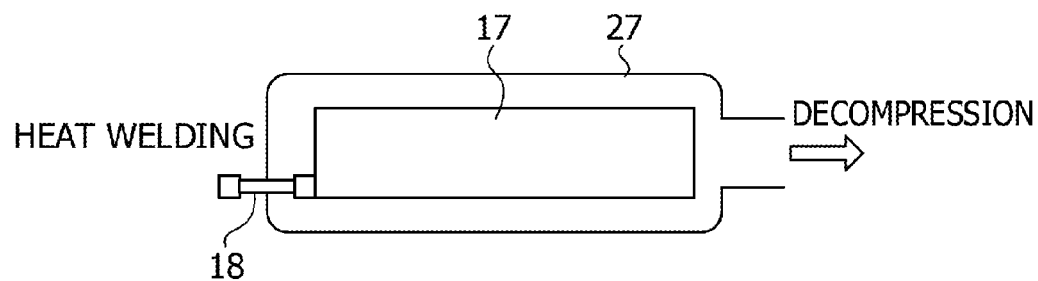
FIGS. 6A and 6B are schematic views illustrating a method of sealing the electronic component.
Figure 6B:
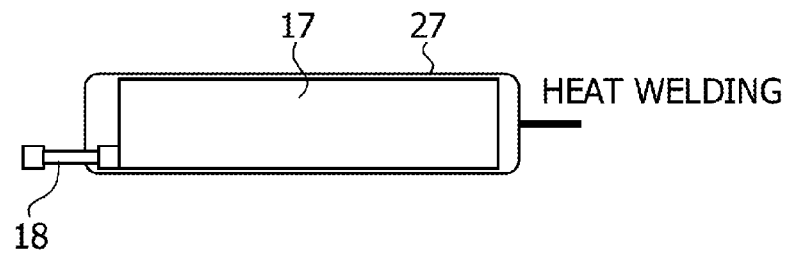

FIGS. 6A and 6B are schematic views illustrating a method of sealing the electronic component 17.

As illustrated in FIG. 6A, the one end side of the tubular pouch 27 is heat-welded in advance to the resin portion 23 of the through card 18. Then, the electronic component 17 is put into the pouch 27 and connected to the connector 22b of the through card 18.

Next, the other end side of the pouch 27 is connected to a decompressing apparatus (not illustrated) so as to decompress the inside of the pouch 27. For example, when the electronic component 17 is immersed in the refrigerant with a depth of 0.3 m, the electronic component 17 receives a pressure of about 6 kPa from the refrigerant 12.

Accordingly, when the pressure inside the pouch 27 is reduced by about 6 kPa or more as compared to the atmospheric pressure, it may be avoided that an air layer having a low heat conductivity is interposed between the pouch 27 and the electronic component 17. Further, the pouch 27 and the electronic component 17 are in close contact with each other.

Thereafter, as illustrated in FIG. 6B, the other end side of the pouch 27 is heat-welded, and the electronic component 17 is sealed in the pouch 27.

In the present embodiment, the one end side of the pouch 27 is heat-welded to the circumference of the resin portion 23. However, the pouch 27 and the resin portion 23 may be adhered to each other by an adhesive.

In the present embodiment, the other end side of the pouch 27 is sealed by the heat-welding. However, the other end side of the pouch 27 may be sealed by an adhesive, a clip or the like. When the other end side of the pouch 27 is sealed by a clip, the electronic component 17 may be taken out from the pouch 27 by removing the clip without tearing the pouch 27.

Figure 7A:
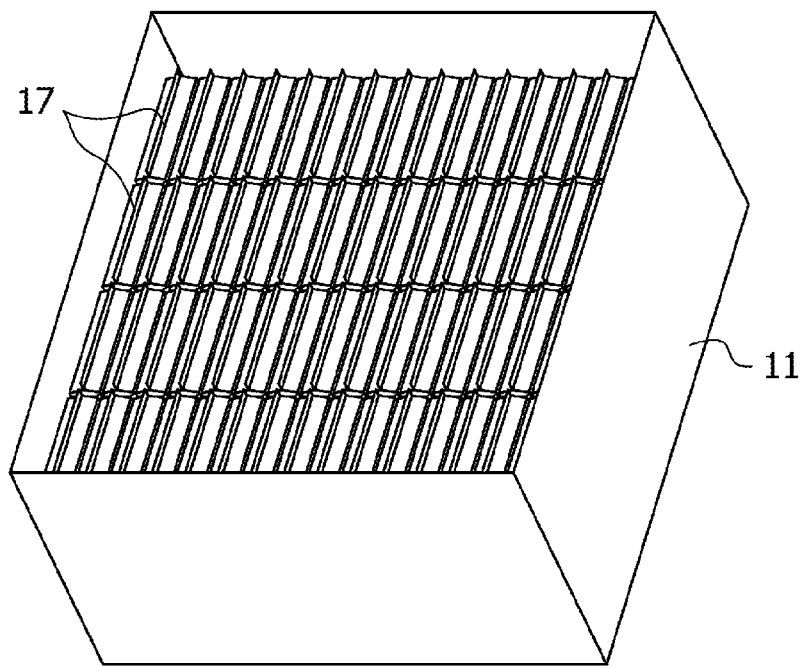
FIGS. 7A and 7B are views (part 1) illustrating a method of replacing the electronic component.
Figure 7B:
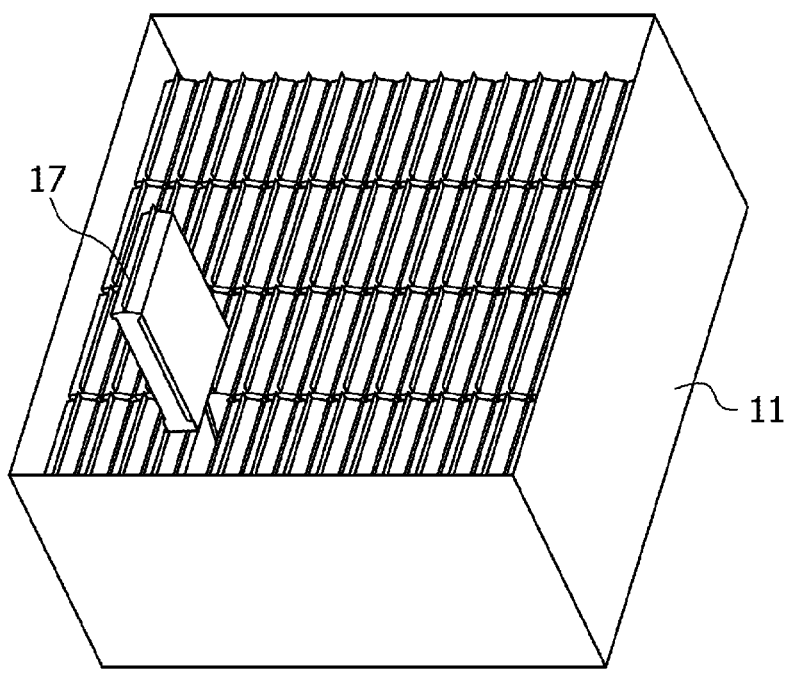
Figure 8A:
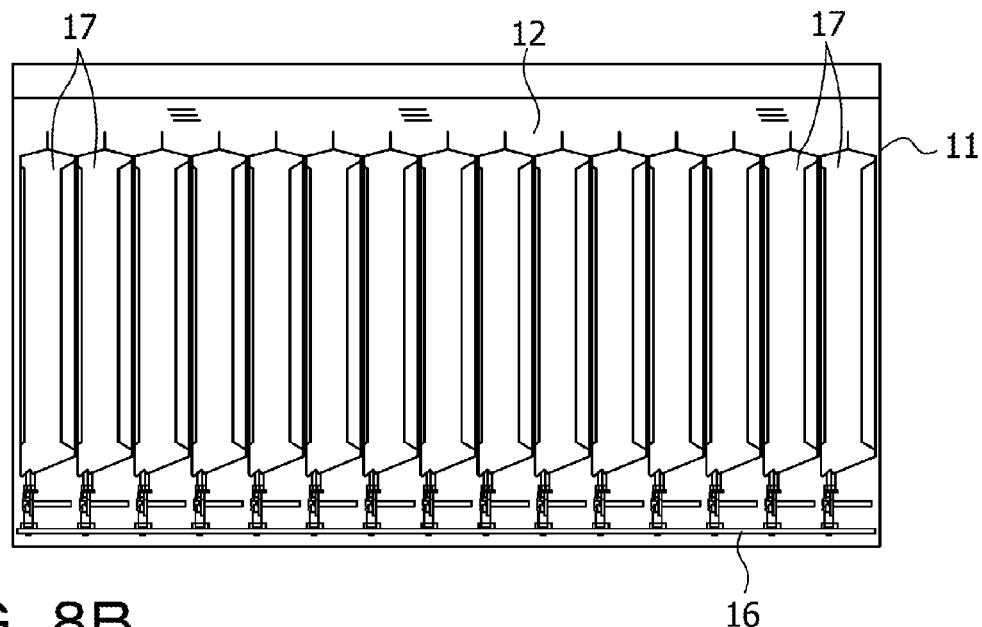
FIGS. 8A and 8B are views (part 2) illustrating a method of replacing the electronic component.
Figure 8B:
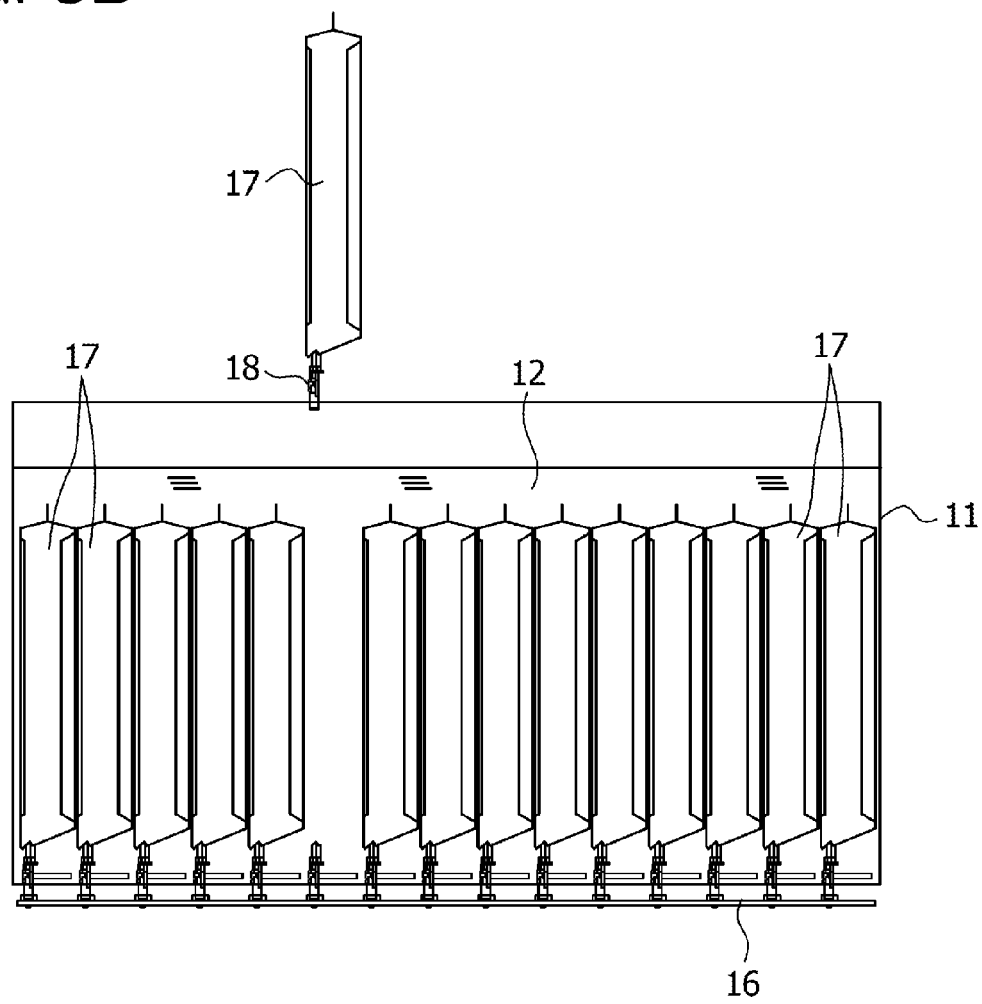

FIGS. 7A, 7B, 8A, and 8B are views illustrating a method of replacing the electronic component 17. FIGS. 7A and 7B are perspective views of the refrigerant tank 11 when viewed obliquely from the top side, and FIGS. 8A and 8B are schematic sectional views of the refrigerant tank 11.

As illustrated in FIGS. 7A and 8A, the plurality of electronic components 17 are immersed in the refrigerant 12 inside the refrigerant tank 11. As illustrated in FIG. 4, each electronic component 17 is sealed in the state of being connected to the through card 18 inside the pouch 27.

Here, when one of the electronic components 17 is failed, the failed electronic component 17 is removed from the circuit board 16 together with the through card 18 as illustrated in FIGS. 7B and 8B. Then, instead of the failed electronic component 17, a normal electronic component 17 is mounted on the circuit board 16. The electronic component 17 for the replacement is also connected to the through card 18 and sealed by the pouch 27.

Hereinafter, effects of the present embodiment will be described. In the present embodiment, since each electronic component 17 is immersed in the refrigerant 12 in the state of being sealed in the pouch 27, the electronic component 17 is not in direct contact with the refrigerant 12. Thus, even when the electronic component 17 is immersed in the refrigerant 12 for a long period time, there is no possibility of the occurrence of problems caused by the refrigerant 12, and the reliability of the electronic component 17 is high.

Further, the present embodiment has the structure in which the electronic component 17 is sealed by the pouch 27 in the state of being connected to the through card 18, and the electronic component 17 is removed from the circuit board 16 together with the through card 18. Thus, when the system is subject to the hot swap, the electronic component 17 may be replaced without stopping the system.

Further, in the present embodiment, since the inside of the pouch 27 is decompressed, the pouch 27 and the electronic component 17 are in close contact with each other, and it may be avoided that an air layer having a low heat conductivity is interposed between the pouch 27 and the electronic component 17. Thus, the heat generated in the electronic component 17 may be quickly moved to the refrigerant 12 so that the electronic component 17 may be appropriately cooled.

The inventors of the present disclosure actually manufactured the electronic equipment according to the above-described embodiment and tested the cooling performance thereof. As a result, it was confirmed that when a 3.5-inch hard disk is immersed in an inert liquid with a depth of 0.3 m, the hard disk may be used at a temperature equal to or less than a standard value (60° C.) for a long period of time. In addition, the power consumption of the hard disk was 10 kW, and the temperature of the refrigerant was 25° C. In this case, a temperature increase of about 3° C. was exhibited by a vendor designated temperature measuring unit.

Figure 9A:
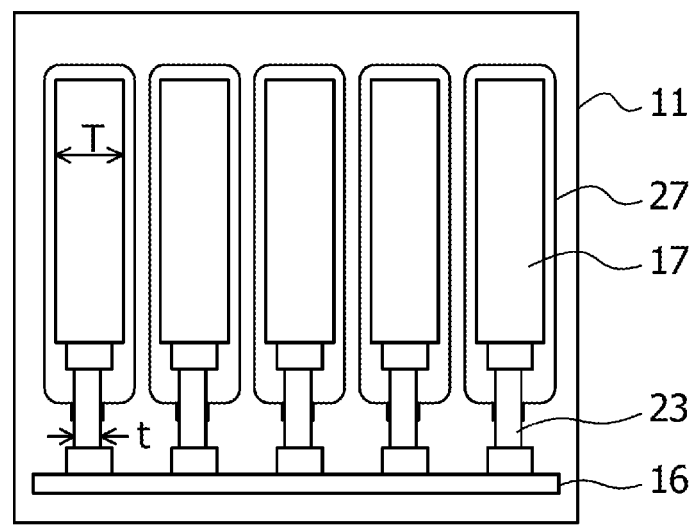
FIG. 9A is a view illustrating an exemplary electronic equipment in which the thickness of a resin portion is smaller than the thickness of an electronic component.
Figure 9B:
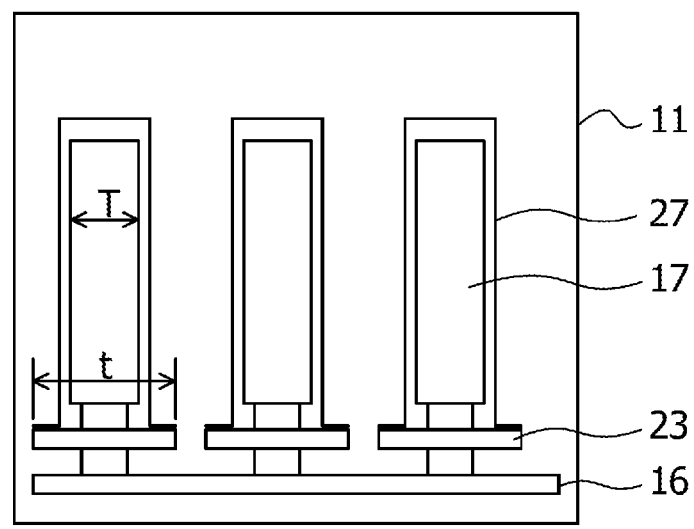
FIG. 9B is a view illustrating an exemplary electronic equipment in which the thickness of a resin portion is larger than the thickness of an electronic component.

However, in the above-described embodiment, the one end side of the pouch 27 is heat-welded to the resin portion 23 of the through card 18, and the thickness (t) of the resin portion is smaller than the thickness T of the electronic component 17 as illustrated in FIG. 9A. For example, when the thickness (t) of the resin portion 23 is larger than the thickness T of the electronic component 17 as illustrated in FIG. 9B, it is difficult to dispose the electronic component 17 with the high density. Thus, the thickness (t) of the resin portion 23 of the through card 18 is required to be smaller than the thickness T of the electronic component 17.

Figure 10:
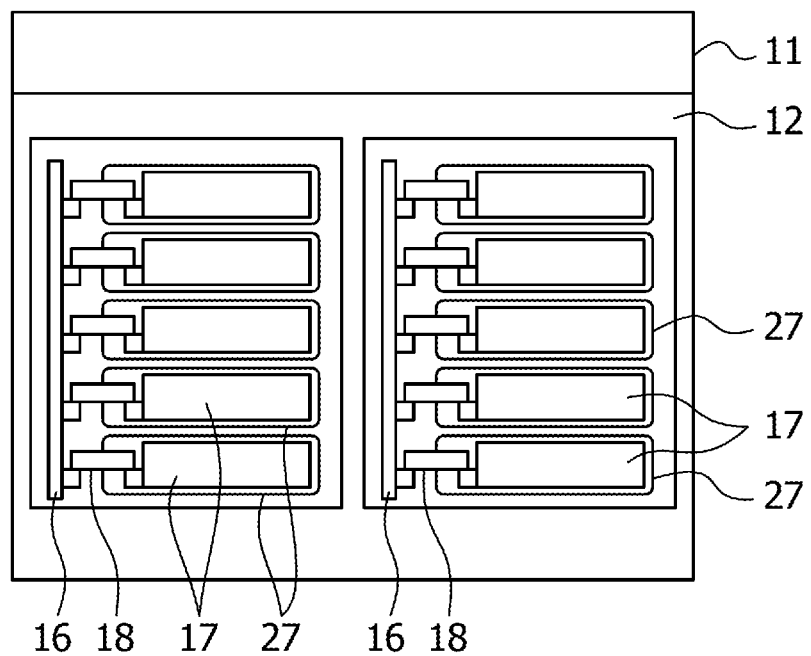
FIG. 10 is a view illustrating an example where electronic components are arranged horizontally.

In the present embodiment, the case where the electronic component 17 is a hard disk has been described. However, the electronic component 17 is not limited to the hard disk and may be, for example, a solid state drive (SSD). In addition, the electronic component 17 may be disposed vertically as illustrated in FIG. 9A or horizontally as illustrated in FIG. 10.

All examples and conditional language recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. An electronic equipment comprising:
a refrigerant tank that contains a refrigerant;
an electronic component;
a through card electrically coupled to the electronic component; and
a pouch of which one end side is in a close contact with the through card so as to seal the electronic component, wherein the electronic component is immersed in the refrigerant of the refrigerant tank in a state of being sealed in the pouch, and
the through card includes:
  a first connector coupled to a circuit board disposed within the refrigerant tank;
  a second connector coupled to the electronic component; and
  a resin portion provided between the first connector and the second connector, wherein the pouch is in a close contact with a circumference of the resin portion.
2. The electronic equipment according to claim 1, wherein a thickness of the resin portion is smaller than a thickness of the electronic component.
3. The electronic equipment according to claim 1, wherein the pouch is formed in a tubular shape of which one end side is in a close contact with the circumference of the resin portion, and the other end side is closed by a welding, an adhesive, or a clip.
4. The electronic equipment according to claim 1, wherein an inside of the pouch is decompressed.
5. The electronic equipment according to claim 1, wherein the refrigerant is a fluorine-based inert liquid.

* * * * *